(12) United States Patent
Azuma

(10) Patent No.: US 8,294,258 B2
(45) Date of Patent: Oct. 23, 2012

(54) POWER SEMICONDUCTOR MODULE

(75) Inventor: Katsunori Azuma, Hitachi (JP)

(73) Assignee: Hitachi, Ltd., Tokyo (JP)

( * ) Notice: Subject to any disclaimer, the term of this patent is extended or adjusted under 35 U.S.C. 154(b) by 19 days.

(21) Appl. No.: 13/078,135

(22) Filed: Apr. 1, 2011

(65) Prior Publication Data

US 2011/0241198 A1 Oct. 6, 2011

(30) Foreign Application Priority Data

Apr. 2, 2010 (JP) ................................ 2010-086094

(51) Int. Cl.
*H01L 23/48* (2006.01)
(52) U.S. Cl. ............... 257/696; 257/E23.039; 257/690; 257/735; 438/106; 438/612
(58) Field of Classification Search ........... 257/E23.039, 257/E23.151, E21.499, 666, 669, 674, 676, 257/678, 690, 696, 735, 778; 438/106–110, 438/612
See application file for complete search history.

(56) References Cited

U.S. PATENT DOCUMENTS

| | | | | |
|---|---|---|---|---|
| 6,040,626 A * | 3/2000 | Cheah et al. | .................. | 257/735 |
| 6,903,450 B2 * | 6/2005 | Funato et al. | .................. | 257/666 |
| 7,042,725 B2 | 5/2006 | Martin et al. | | |
| 7,122,885 B2 * | 10/2006 | Planey | .......................... | 257/676 |
| 7,285,849 B2 * | 10/2007 | Cruz et al. | .................... | 257/690 |
| 7,683,464 B2 * | 3/2010 | Sun et al. | ....................... | 257/666 |
| 7,745,253 B2 * | 6/2010 | Luechinger | ................... | 438/106 |
| 7,745,913 B2 * | 6/2010 | Hosseini et al. | .............. | 257/674 |
| 7,851,927 B2 * | 12/2010 | Hosseini et al. | .............. | 257/778 |
| 7,977,775 B2 * | 7/2011 | Yato et al. | ..................... | 257/666 |
| 8,013,441 B2 * | 9/2011 | Bauer et al. | .................... | 257/735 |
| 8,049,312 B2 * | 11/2011 | Herbsommer et al. | ....... | 257/666 |
| 2008/0111232 A1 * | 5/2008 | Pavier | ........................... | 257/711 |
| 2008/0251909 A1 | 10/2008 | Tokuyama et al. | | |

FOREIGN PATENT DOCUMENTS

| | | |
|---|---|---|
| EP | 1 467 607 B1 | 8/2007 |
| JP | 2000-349207 A | 12/2000 |
| JP | 2008-259267 A | 10/2008 |

* cited by examiner

*Primary Examiner* — Chris Chu
(74) *Attorney, Agent, or Firm* — Crowell & Moring LLP

(57) ABSTRACT

In a power semiconductor module, a semiconductor device including electrode surfaces for connection on its front side and back side is connected on its back side to a first extraction electrode through soldering; a metal surface of one side of a laminated conductor having a laminated structure in which at least two types of metals are laminated is directly, intermetallically connected to the front side of the semiconductor device; a second extraction electrode is connected to a metal surface of another side of the laminated conductor through soldering; and the laminated conductor includes a plurality of arch-like protrusions and a straight section connecting the arch-like protrusions, the straight section is connected with the front side of the semiconductor device, and the protrusions are connected with the second extraction electrode.

8 Claims, 6 Drawing Sheets

POWER SEMICONDUCTOR MODULE

INCORPORATION BY REFERENCE

The disclosure of the following priority application is herein incorporated by reference: Japanese Patent Application No. 2010-086094 filed Apr. 2, 2010

BACKGROUND OF THE INVENTION

1. Field of the Invention

The present invention relates to a power semiconductor module, in particular a power semiconductor module preferred for a power conversion unit that converts DC power into AC power or AC power into DC power.

2. Description of Related Art

A power conversion unit includes a function to convert DC power supplied from a DC power supply into AC power so as to supply AC power to an AC load such as a rotating electrical machine or a function to convert AC power generated by a rotating electrical machine into DC power so as to supply DC power to a DC power supply.

To serve such conversion function, the power conversion unit includes an inverter having a semiconductor device with a switching function, and, by repeating conduction and interruption of the semiconductor device, power conversion is performed from DC power to AC power or AC power to DC power.

The switching semiconductor device generates heat upon switching or upon energization. Due to this, the semiconductor device is mounted on a high thermal conductivity member to form a heat dissipation structure.

In particular for reducing the power conversion unit in size and cost, it is desirable to adopt a high heat dissipation structure and to reduce the area of the semiconductor device.

Japanese Laid Open Patent Publication No. 2008-259267 discloses a structure in which both sides of a semiconductor device are soldered to a high thermal conductivity member so that heat is dissipated through the both sides of the semiconductor device.

In addition, EP1467607 discloses a structure in which cylindrical metal is soldered on a chip and a metal plate is soldered on a top surface of the metal soldering so that heat is dissipated through both sides of a semiconductor device.

In addition, Japanese Laid Open Patent Publication No. 2000-349207 discloses a structure in which a Si chip is sandwiched by a jointing member and a heat sink so as to suppress thermal stress based upon a difference in coefficient of thermal expansion.

However, the stress was not sufficiently reduced inside the power semiconductor module and thus reliability was not sufficiently ensured.

SUMMARY OF THE INVENTION

The present invention is to provide a power semiconductor module with improved reliability.

A power semiconductor module according to a first aspect of the present invention, wherein: a semiconductor device including electrode surfaces for connection on its front side and back side is connected on its back side to a first extraction electrode through soldering; a metal surface of one side of a laminated conductor having a laminated structure in which at least two types of metals are laminated is directly, intermetallically connected to the front side of the semiconductor device; a second extraction electrode is connected to a metal surface of another side of the laminated conductor through soldering; and the laminated conductor includes a plurality of arch-like protrusions and a straight section connecting the arch-like protrusions, the straight section is connected with the front side of the semiconductor device, and the protrusions are connected with the second extraction electrode.

According to a second aspect of the present invention, in the power semiconductor module according to the first aspect, the laminated conductor may be a conductor on which copper and aluminium are laminated, an aluminium side of the laminated conductor may be directly metal joined to the front side of the semiconductor device, and a copper side may be joined to the second extraction electrode through soldering.

According to a third aspect of the present invention, in the power semiconductor module according to the first aspect, it is preferable that the front side of the semiconductor device and the metal surface of the one side of the laminated conductor are ultrasonically connected.

According to a fourth aspect of the present invention, in the power semiconductor module according to the first aspect, an end of the first extraction electrode may constitute a first terminal for external connection, and an end of the second extraction electrode may constitute a second terminal for external connection.

According to a fifth aspect of the present invention, in the power semiconductor module according to the first aspect, it is preferable to comprise a first cooling device that cools the power semiconductor module, wherein: the first extraction electrode and the laminated conductor are arranged on a heat receiving surface of the first cooling device through a flat plate-like insulating plate, and the second extraction electrode includes a second cooling device.

According to a sixth aspect of the present invention, in the power semiconductor module according to the fifth aspect, it is preferable that the first and second cooling devices are metal conductors in which cooling fins are formed.

In a power semiconductor module according to a seventh aspect, a semiconductor device including electrode surfaces for connection on its front side and back side is connected on its back side to a first extraction electrode through soldering; a metal surface of one side of a laminated conductor having a laminated structure in which at least two types of metals are laminated is directly, intermetallically connected to the front side of the semiconductor device; a second extraction electrode is connected to a metal surface of another side of the laminated conductor through soldering; the laminated conductor includes a plurality of arch-like protrusions and a straight section connecting the arch-like protrusions, the straight section is connected with the front side of the semiconductor device, and the protrusions are connected with the second extraction electrode; the first extraction electrode and the laminated conductor are arranged on a surface of one side of a flat plate-like first cooling device through a flat plate-like insulating plate, and the second extraction electrode is arranged on a surface of one side of a flat plate-like second cooling device; and a capacitor to suppress voltage variations when switching is arranged on a surface of another side of the first cooling device, and a driver board that drives switching of the semiconductor device is arranged on a top surface of the capacitor.

A power conversion unit according to a eighth aspect of the present invention comprises: a power semiconductor module wherein: a semiconductor device including electrode surfaces for connection on its front side and back side is connected on its back side to a first extraction electrode through soldering; a metal surface of one side of a laminated conductor having a laminated structure in which at least two types of metals are laminated is directly, intermetallically connected to the front side of the semiconductor device; and a second extraction electrode is connected to a metal surface of another side of the laminated conductor through soldering, wherein: the laminated conductor includes a plurality of arch-like protrusions and a straight section connecting the arch-like protrusions, the straight section is connected with the front side of the semiconductor device, and the protrusions are connected with the second extraction electrode; the first extraction electrode and the laminated wiring conductor are arranged on a surface of one side of a flat plate-like first cooling device, inside of which a cooling passage is formed, through a flat plate-like insulating plate, and the second extraction electrode is arranged on a surface of one side of a flat plate-like second cooling device, inside of which a cooling passage is formed; and a capacitor to suppress voltage variations when switching is arranged on a surface of another side of the first cooling device, and a driver board that drives switching of the semiconductor device is arranged on a top surface of the capacitor.

DESCRIPTION OF PREFERRED EMBODIMENTS

The principle of the present embodiment will now be explained before an embodiment of the present invention is explained.

In a double-sided cooling structure of a conventional semiconductor device, a high thermal conductivity metal is soldered onto the both sides of the semiconductor device. This causes stress concentration on a soldered section due to a difference in linear expansion coefficient between the semiconductor device and the soldered high thermal conductivity metal with increasing temperature in the semiconductor device, thereby causing a crack or the like to occur with long-term use. Because of this, the periphery of the metal is bonded with a resin so as to prevent the metal section from expanding, and the metal is brazed with ceramic to reduce an apparent coefficient of thermal expansion so as to reduce stress to the solder, thereby preventing life degradation.

However, since the double-sided cooling structure is a structure in which the semiconductor device is sandwiched by metal from the both sides, stress is directly applied to the semiconductor device and the solder when assembling or implementing an inverter, and those may be cracked.

In addition, production of the semiconductor device requires plating to solder the both sides, thereby making the processing more complicated than a conventional single-sided process.

On the surface of the semiconductor device, there are regions of an electrode pad for switching control, an electrode pad for a current sensor or a temperature sensor, and the like. In addition to those regions, on the outer circumference of the semiconductor device, there is a region in which device voltage-resistance is ensured, and it is necessary to prevent those regions from shorting out or being contaminated. As a result, plating for soldering both sides not only increases plating cost but also reduces reliability and yield, thereby increasing cost. In addition, it has a heavy environmental load such as plating rinse water treatment.

In view of those problems, the present invention is to provide a power semiconductor module having a heat dissipation structure in which the both sides of the semiconductor device are cooled by using a semiconductor device having undergone a single-sided plating process and reducing internal stress.

Since the present embodiment includes the following structure, a heat dissipation structure can be achieved in which the semiconductor device constituting a power semiconductor module can be cooled on the both sides and internal stress can be reduced, using a semiconductor device having undergone a single-sided plating process.

The embodiment will now be explained with reference to the attached drawings.

Figure 1:
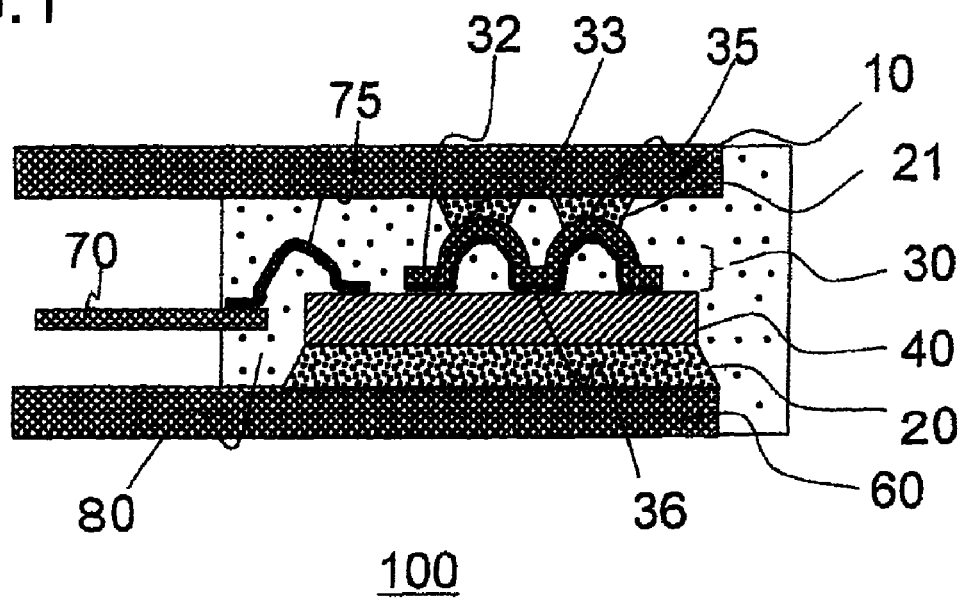
FIG. 1 is an illustration of a semiconductor module according to an embodiment of the present invention.
Figure 2:
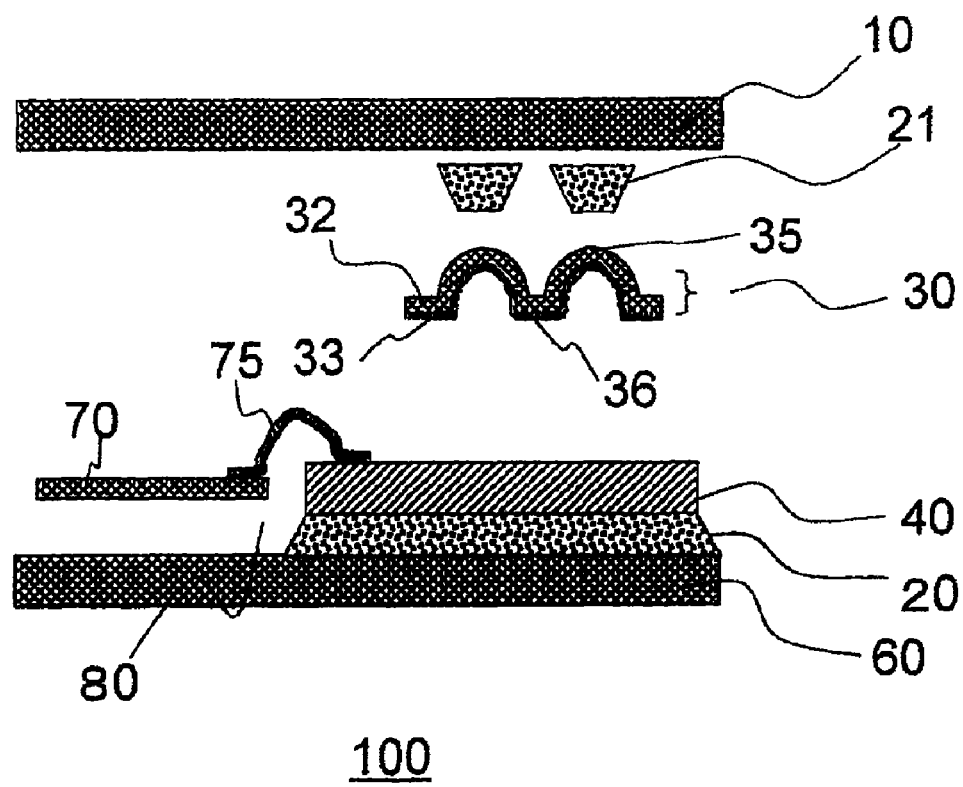
FIG. 2 is a connection exploded view of the semiconductor module.

FIG. 1 is an illustration of a semiconductor module according to the present embodiment. In addition, FIG. 2 is a connection exploded view of the semiconductor module.

A semiconductor device 40 is connected to an external extraction electrode 60 through a solder 20 on its bottom electrode, and the top control electrode of the semiconductor device 40 is connected to an external extraction electrode (control terminal) 70 through a control wire 75.

A cladding material 30 including two types of metal layers is ultrasonically connected to the top electrode of the semiconductor device. The top electrode of the high-current semiconductor device 40 is made of aluminium. The cladding material 30 is constituted with the two layers of an aluminium 33 and a copper 32, the aluminium 33 side of which faces the top surface of the semiconductor device so as to enable ultrasonic welding. After this ultrasonic welding, an external extraction electrode 10 and the copper 32 side of the cladding material 30 are joined with a solder 21. In addition, their exterior is solidified with a mold resin 80. Thus, a double-sided cooling module 100 is configured in which the semiconductor device 40 can be cooled on the top side and the bottom side. The cladding material 30 is a thin flat plate whose thickness is configured to be equal to or less than 0.2 mm so as to facilitate transmission of a ultrasonic frequency to a joint interface, as in a conventional ultrasonic connection, thereby ensuring connection with the top surface of the semiconductor device 40.

Here, the cladding material 30 is constituted with an arch section 35 and a straight section 36 so that the upper side of the semiconductor device 40 can be divided into the straight section 36 to be ultrasonically connected and the arch section 35 to be connected with the solder 21. This arch section 35 can relieve stress applied from the upper side of the semiconductor device 40.

A section of the cladding material 30 to be connected to the external extraction electrode 10 is arched so that even if, when connecting with the electrode 10, a variation in thickness of the solder 20 causes the semiconductor device 40 to lean and thus causes a variation in height, the arch section 35 is deformed so as to accommodate the variations. This can provide a secure soldering connection between the cladding material 30 and the electrode 10.

Thus, the surface of the semiconductor device 40 and the straight section 36 of the cladding material 30 are once ultrasonically connected so as to provide a connection to reliably cool the both sides of the semiconductor device 40 compared to a conventional double-sided cooling structure, in which a surface of a semiconductor device is directly soldered. In addition, the semiconductor device 40 may undergo a conventional process. More specifically, the surface may not be provided with plating for soldering, thereby preventing an increase in cost and reduction in yield.

The control terminal 70 is a terminal at which voltage for switching on or off the semiconductor device 40 is applied from the outside, and is connected with the semiconductor device 40 through the control terminal wire 75 such as an aluminium wire. While in this figure the terminal 70 is illustrated between the extraction electrodes 10 and 60 in the interests of brevity, the terminal 70 is provided on the same plane as the electrode 60 and the wiring is provided when the top surface of the semiconductor device 40 is seen, i.e., before the electrode 10 is connected with the solder 21, as shown in FIG. 2.

First Embodiment

Figure 3:
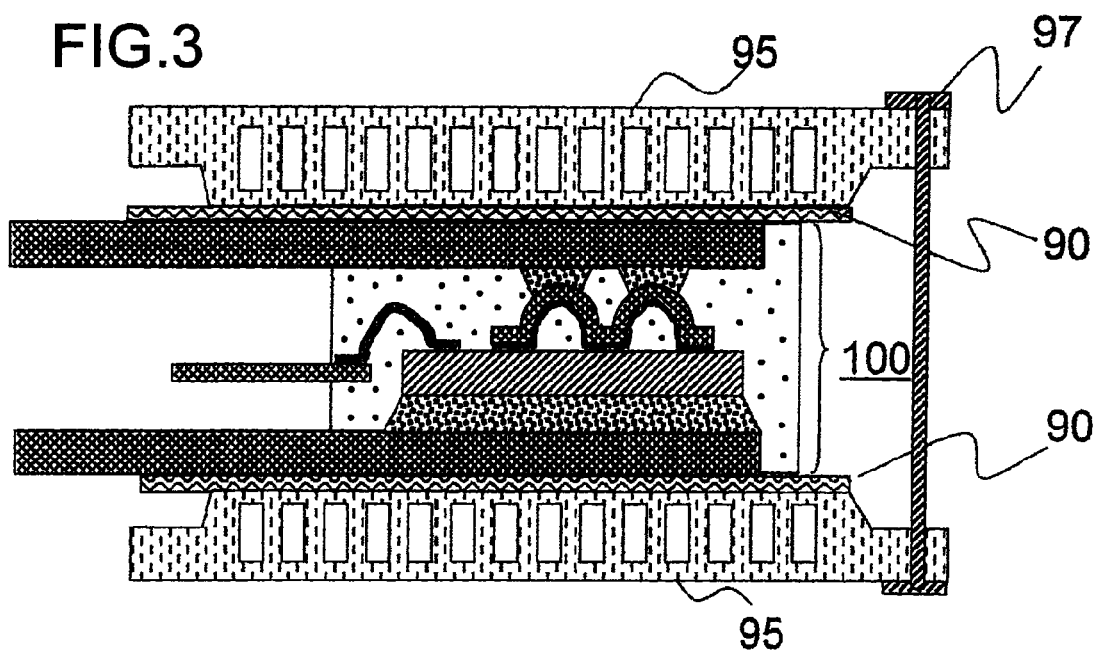
FIG. 3 is an illustration of the first embodiment of a double-sided cooling module.

FIG. 3 is an illustration of the first embodiment of the double-sided cooling module 100. The top and bottom surfaces of the double-sided cooling module 100 are sandwiched by cooling fins 95 through insulating plates 90 and fixed with a fixing bracket 97. Here, a plurality of the fixing brackets 97 are disposed so as to uniformly pressurize the double-sided cooling module 100.

The insulating plates 90 are made of ceramic such as aluminium nitride, silicon nitride, and alumina or high thermal conductivity resin. When made of ceramic, the insulating plates 90 may be brazed to the cooling fins 95. The insulating plates 90 brazed to both the cooling fins 95 and the external extraction electrode may be used. When made of resin, the insulating plates 90 adhered to the cooling fins 95 in advance may be used.

Second Embodiment

Figure 4:
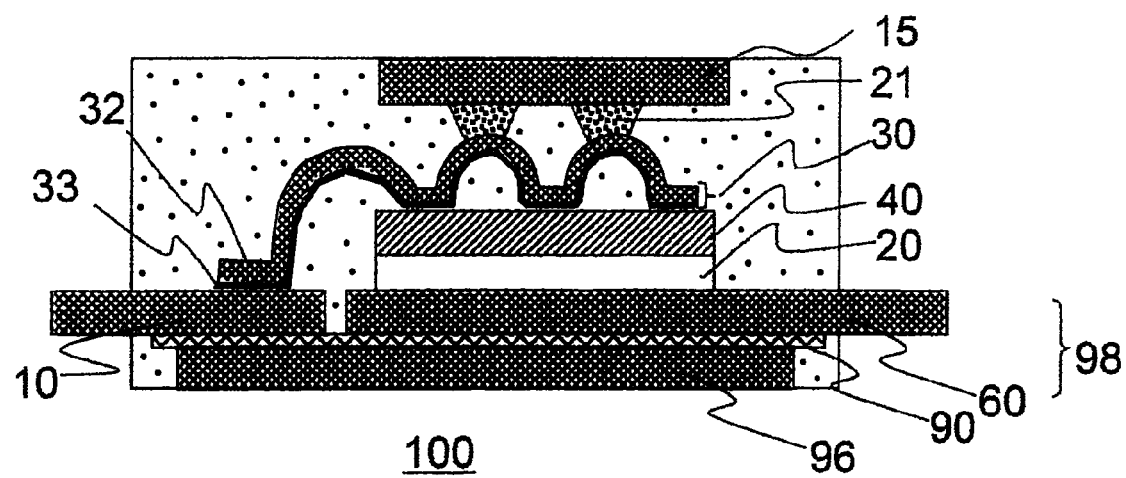
FIG. 4 is an illustration of the second embodiment of the double-sided cooling module.

FIG. 4 is an illustration of the second embodiment of the double-sided cooling module 100. As shown in the figure, the semiconductor device 40 is connected through the solder 20 to the top surface of an insulation metal board 98 in which the extraction electrodes 10 and 60 are formed on the top surface of the insulating plate 90 and a cooling metal plate 96 is brazed onto the bottom surface of the insulating plate 90. The aluminium 33 side of the cladding material 30 is ultrasonically connected to the electrode 10 of the semiconductor device 40. In addition, a cooling metal plate 15 is connected through the solder 21 to the copper 32 side of the cladding material 30. This allows a current path and a cooling path of the top surface of the semiconductor device to be separated. This allows heat generation due to current flowing through the cooling path itself of the top surface of the semiconductor device 40 to be reduced. In addition, the top surface cooling structure can be achieved in a structure similar to a conventional semiconductor module. It is to be noted that the control terminal 70 is curtailed in this figure. In addition, the cooling metal plate 15 of the top surface can be replaced with an insulation metal board 98.

Third Embodiment

Figure 5:
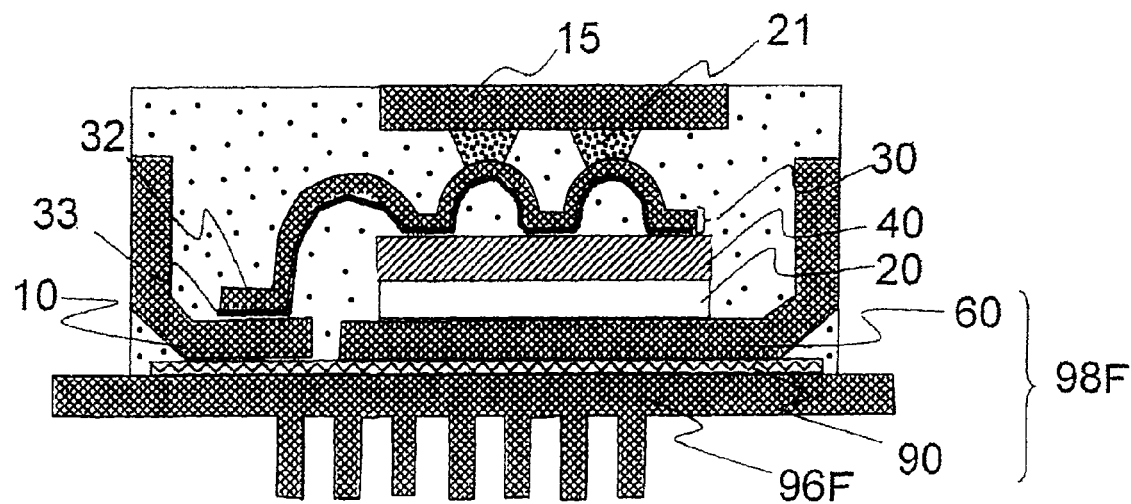
FIG. 5 is an illustration of the third embodiment of the double-sided cooling module.

FIG. 5 is an illustration of the third embodiment of the double-sided cooling module 100. An insulation board 98F with fins is utilized, which is configured by brazing the electrodes 10 and 60 onto the top surface of the insulating board 90 and brazing a cooling metal plate 96F with fins onto the bottom surface of the insulating board 90, and the semiconductor device 40 is connected through the solder 20 to an electrode 2. The aluminium 33 side of the cladding material 30 is ultrasonically connected to the semiconductor device 40 and the electrode 10. In addition, the cooling metal plate 15 is connected through the solder 21 to the copper 32 side of the cladding material 30. It is to be noted that the cooling metal plate 15 of the top surface can be replaced with an insulation metal board 98F with fins.

Fourth Embodiment

Figure 6:
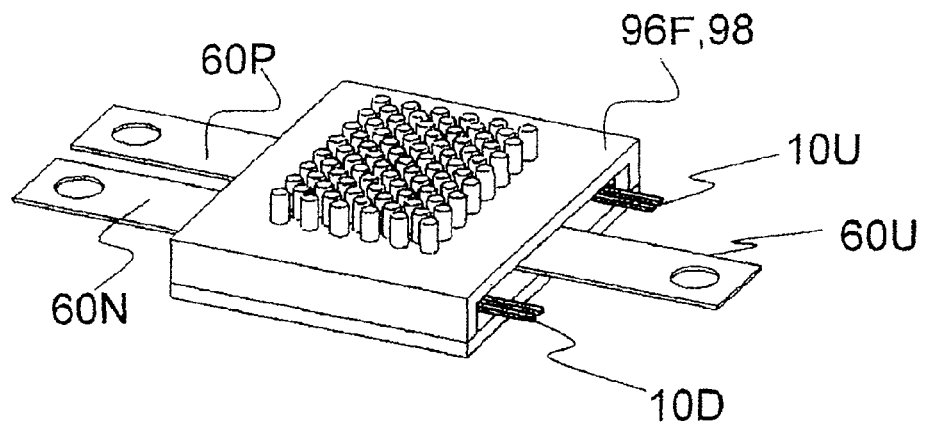
FIG. 6 is an illustration of the fourth embodiment of the double-sided cooling module.

FIG. 6 is an illustration of the fourth embodiment of the double-sided cooling module 100. This is an example in which the insulation board 98F with fins are used on both sides and two switching circuits are mounted. There are external terminals of a terminal 60P connected to a higher potential side, a terminal 60N connected to a lower potential side, and a terminal 60U that outputs higher potential or lower potential depending upon switching. In addition, a control terminal 10U of the higher potential side and an output terminal 10D of the lower potential side are provided to drive switching circuits of the higher potential side and the lower potential side.

Figure 7:
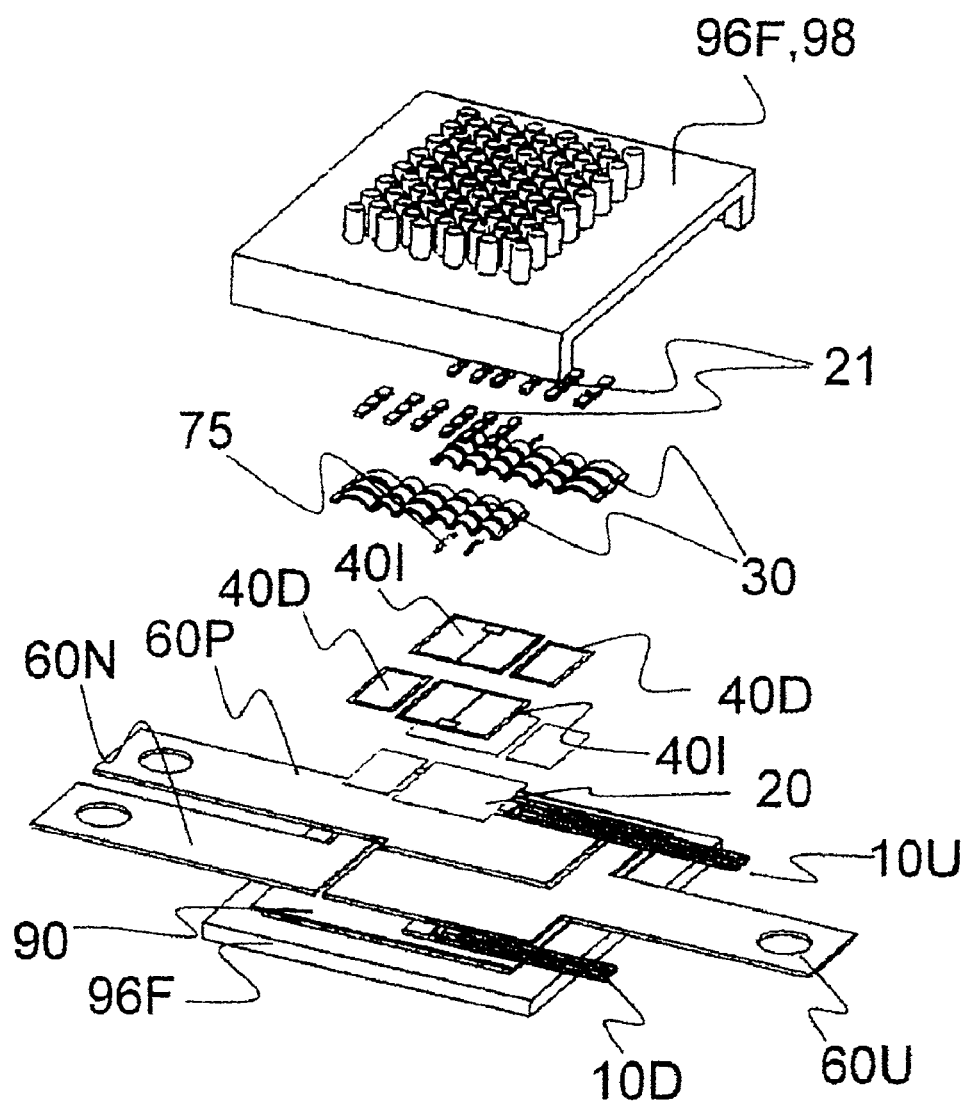
FIG. 7 is an exploded view of the semiconductor module according to the fourth embodiment.

FIG. 7 is an exploded view of the semiconductor module according to the fourth embodiment. An IGBT chip 401 and a diode chip 40D are connected with the solder 20 onto an insulation board with fins constituted by brazing the fins 96F, the insulating board 90, the electrodes 60P, 60N, and 60U, and the control wirings 10U and 10D. This allows the chip back sides to be connected to the electrodes. The chip top surfaces are connected with the extraction electrodes through the cladding material 30 and connected with the insulation board 98F with fins through the solder 21. Thus the double-sided cooling module is configured. It is to be noted that a molding material is not shown in the figure.

Fifth Embodiment

Figure 8:
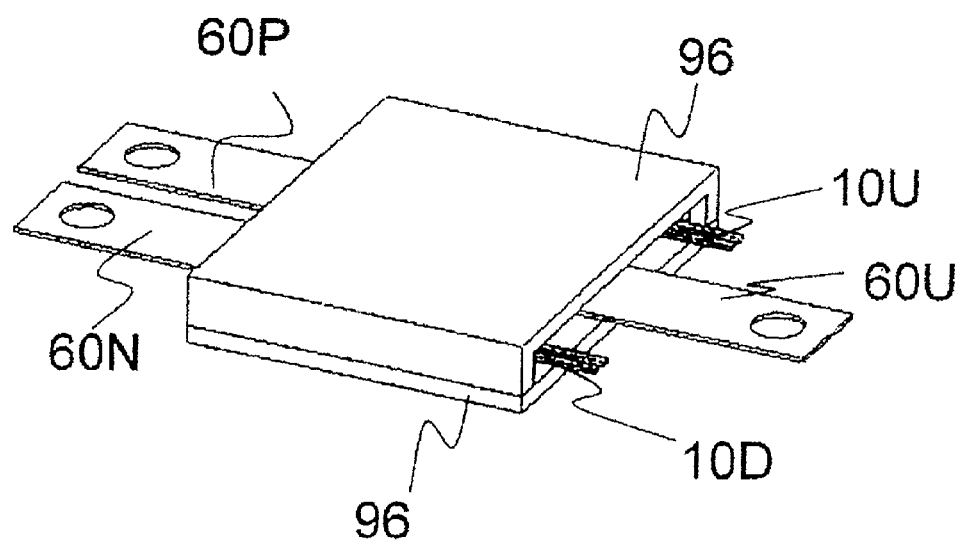
FIG. 8 is an illustration of the fifth embodiment of the double-sided cooling module.

FIG. 8 is an illustration of the fifth embodiment of the double-sided cooling module 100. This is an example in which the cooling metal plates 96 on which the semiconductor device 40 is brazed are used on both sides so as to cool the semiconductor device from the both sides of the chips and in which two switching circuits are mounted. There are external terminals of the terminal 60P connected to the higher potential side, the terminal 60N connected to the lower potential side, and the terminal 60U that outputs higher potential or lower potential depending upon switching. In addition, there are the control terminal 10U of the higher potential side and the output terminal 10D of the lower potential side for switching the higher potential and lower potential sides.

Figure 9:
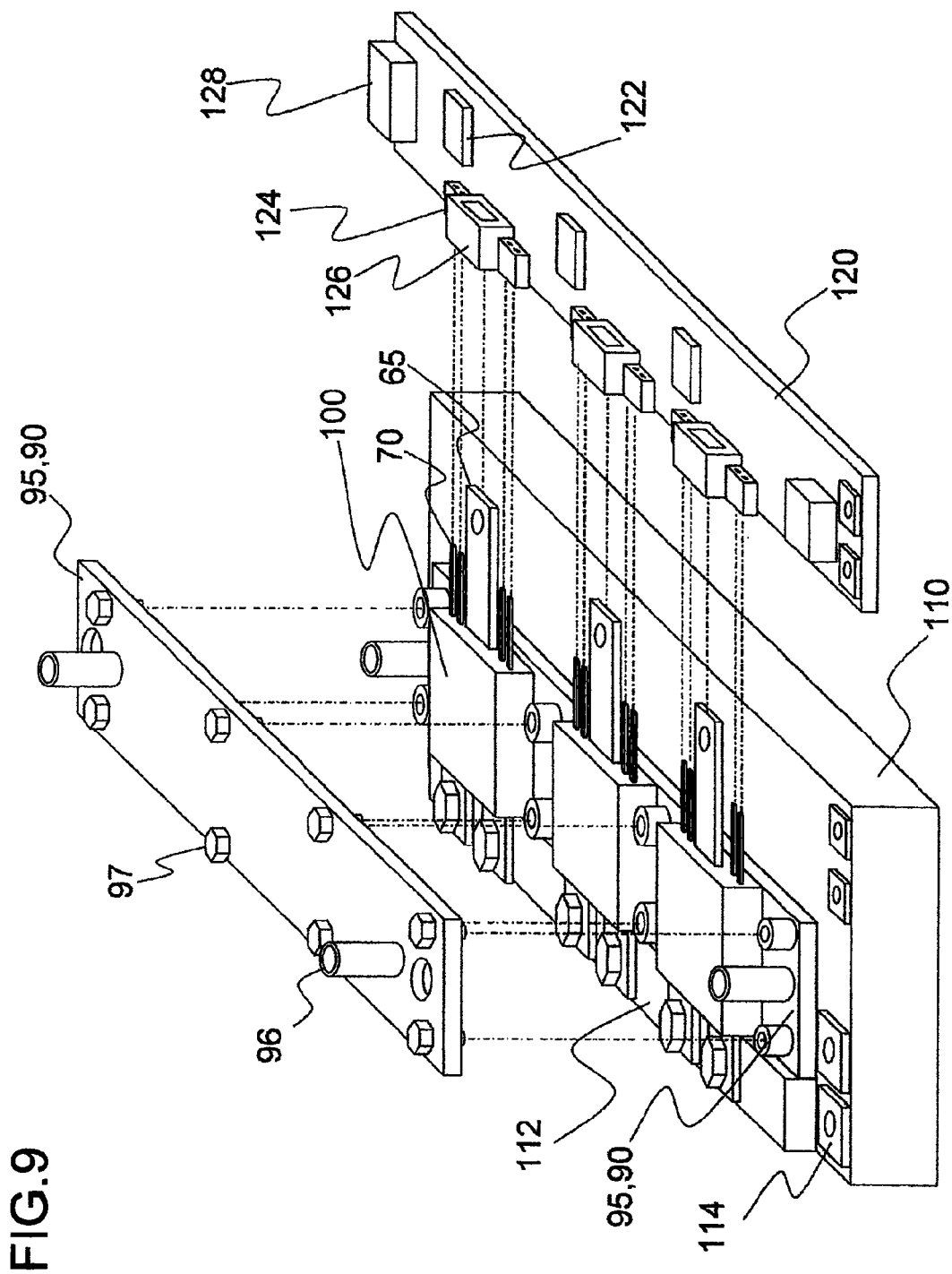
FIG. 9 is an illustration of an implementation example of an inverter using the double-sided cooling module.

FIG. 9 is an illustration of an implementation example of an inverter (power conversion unit) using the double-sided cooling module 100. A plate-like pipe unit 95 with built-in cooling fins is placed on a smoothing capacitor 110 for supplying current when switching. The extraction electrodes of the double-sided cooling module 100 are connected and fixed to a connection terminal 112.

The plate-like pipe unit 95 is fixed with the fixing bracket 97 so as to sandwich the double-sided cooling module 100. At this time, grease with high adhesion and high heat transfer rate may be provided between the pipe unit and the module. In addition, a control terminal connector 124 connects between a control board 120 and the double-sided cooling module 100. A switching control IC122 is mounted on the control board 120 so as to drive a gate of the semiconductor device 40 in the double-sided cooling module.

The double-sided cooling module 100 includes a circuit in which two switching semiconductor devices are connected in series and has a structure in which voltage is output from a section connected in series so that any one of the both end voltages of the series circuit can be output. For this reason, there is a wiring unit 65 to extract potential from the connected section. This wiring unit 65 is connected to a cable connected to a motor. The control board 120 is mounted with a current sensor 126 that monitors current to the motor, and transmits a monitoring result to an external microcomputer board (not shown in the figures) through a connector 128.

The smoothing capacitor module 110 includes a terminal 114 that connects a cable from a battery, which is a power supply. The smoothing capacitor module is provided with a built-in filtering reactor and a built-in discharge resistor in addition to the smoothing capacitor device.

As explained above, according to the semiconductor module of the present embodiments, a conventionally processed semiconductor device (semiconductor device having undergone a single-sided plating process) is used to provide a power semiconductor module which has a heat dissipation structure to cool the both sides of the semiconductor device and can reduce internal stress. This allows a power conversion unit using a small-sized, low-cost semiconductor device to be provided. In addition, inductance of the power semiconductor module can be reduced, and an increase in volume can be suppressed.

According to the above embodiments, the power semiconductor module can be improved in reliability.

The above described embodiments are examples, and various modifications can be made without departing from the scope of the invention.

What is claimed is:

1. A power semiconductor module, wherein:
   a semiconductor device including electrode surfaces for connection on its front side and back side is connected on its back side to a first extraction electrode through soldering;
   a metal surface of one side of a laminated conductor having a laminated structure in which at least two types of metals are laminated is directly, intermetallically connected to the front side of the semiconductor device;
   a second extraction electrode is connected to a metal surface of another side of the laminated conductor through soldering; and
   the laminated conductor includes a plurality of arch-like protrusions and a straight section connecting the arch-like protrusions, the straight section is connected with the front side of the semiconductor device, and the protrusions are connected with the second extraction electrode.

2. A power semiconductor module according to claim 1, wherein:
   the laminated conductor is a conductor on which copper and aluminium are laminated, an aluminium side of the laminated conductor is directly metal joined to the front side of the semiconductor device, and a copper side is joined to the second extraction electrode through soldering.

3. A power semiconductor module according to claim 1, wherein:
   the front side of the semiconductor device and the metal surface of the one side of the laminated conductor are ultrasonically connected.

4. A power semiconductor module according to claim 1, wherein:
   an end of the first extraction electrode constitutes a first terminal for external connection, and an end of the second extraction electrode constitutes a second terminal for external connection.

5. A power semiconductor module according to claim 1, comprising:
   a first cooling device that cools the power semiconductor module, wherein:
   the first extraction electrode and the laminated conductor are arranged on a heat receiving surface of the first cooling device through a flat plate-like insulating plate, and the second extraction electrode includes a second cooling device.

6. A power semiconductor module according to claim 5, wherein:
   the first and second cooling devices are metal conductors in which cooling fins are formed.

7. A power semiconductor module, wherein:
   a semiconductor device including electrode surfaces for connection on its front side and back side is connected on its back side to a first extraction electrode through soldering;
   a metal surface of one side of a laminated conductor having a laminated structure in which at least two types of metals are laminated is directly, intermetallically connected to the front side of the semiconductor device;
   a second extraction electrode is connected to a metal surface of another side of the laminated conductor through soldering;
   the laminated conductor includes a plurality of arch-like protrusions and a straight section connecting the arch-like protrusions, the straight section is connected with the front side of the semiconductor device, and the protrusions are connected with the second extraction electrode;
   the first extraction electrode and the laminated conductor are arranged on a surface of one side of a flat plate-like first cooling device through a flat plate-like insulating plate, and the second extraction electrode is arranged on a surface of one side of a flat plate-like second cooling device; and
   a capacitor to suppress voltage variations when switching is arranged on a surface of another side of the first cooling device, and a driver board that drives switching of the semiconductor device is arranged on a top surface of the capacitor.

8. A power conversion unit, comprising:
   a power semiconductor module wherein:
   a semiconductor device including electrode surfaces for connection on its front side and back side is connected on its back side to a first extraction electrode through soldering;
   a metal surface of one side of a laminated conductor having a laminated structure in which at least two types of metals are laminated is directly, intermetallically connected to the front side of the semiconductor device; and
   a second extraction electrode is connected to a metal surface of another side of the laminated conductor through soldering, wherein:

the laminated conductor includes a plurality of arch-like protrusions and a straight section connecting the arch-like protrusions, the straight section is connected with the front side of the semiconductor device, and the protrusions are connected with the second extraction electrode;

the first extraction electrode and the laminated wiring conductor are arranged on a surface of one side of a flat plate-like first cooling device, inside of which a cooling passage is formed, through a flat plate-like insulating plate, and the second extraction electrode is arranged on a surface of one side of a flat plate-like second cooling device, inside of which a cooling passage is formed; and a capacitor to suppress voltage variations when switching is arranged on a surface of another side of the first cooling device, and a driver board that drives switching of the semiconductor device is arranged on a top surface of the capacitor.

* * * * *